United States Patent
Nozawa et al.

[11] Patent Number: 6,030,455
[45] Date of Patent: Feb. 29, 2000

[54] SUBSTRATE HOLDER

[75] Inventors: Naoyuki Nozawa, Tokorozawa; Yoshiro Hasegawa, Tama, both of Japan

[73] Assignee: Anelva Corporation, Japan

[21] Appl. No.: 09/123,026

[22] Filed: Jul. 27, 1998

[30] Foreign Application Priority Data

Sep. 20, 1997 [JP] Japan ................................. 9-273487

[51] Int. Cl.⁷ ................................................. B05C 13/00
[52] U.S. Cl. .......................................... 118/500; 118/728
[58] Field of Search ..................................... 118/728, 500

[56] References Cited

U.S. PATENT DOCUMENTS

| | | |
|---|---|---|
| 4,595,481 | 6/1986 | Allen et al. . |
| 4,634,512 | 1/1987 | Allen et al. . |
| 4,735,540 | 4/1988 | Allen et al. . |
| 4,735,701 | 4/1988 | Allen et al. . |
| 5,089,110 | 2/1992 | Allen et al. . |
| 5,296,118 | 3/1994 | Allen et al. . |
| 5,543,022 | 8/1996 | Nguyen et al. . |

FOREIGN PATENT DOCUMENTS

| | | |
|---|---|---|
| 5-23570 | 6/1993 | Japan . |
| 5-94267 | 12/1993 | Japan . |
| 8-274142 | 10/1996 | Japan . |

*Primary Examiner*—Richard Bueker
*Attorney, Agent, or Firm*—Coudert Brothers

[57] ABSTRACT

A substrate holder for holding a circular substrate in a vertical position during processing of the substrate. The substrate holder is provided with a vertical base plate and three support claws which are mounted on the base plate and which hold the peripheral edge of a substrate. One of the three support claws is a fixed support claw which holds the edge of the substrate at the bottom to support and whose position does not change when the weight of the substrate is supported. The other two support claws are moveable and may be actuated to hold the edge of the substrate at its sides to restrain motion of the substrate. The moveable support claws can be opened and closed for substrate mounting and removal. The two movable support claws are installed on the base plate in a manner so that when the substrate is supported by the fixed support claw they contact the side edge at locations which are higher than the height of the center of the substrate.

19 Claims, 7 Drawing Sheets

SUBSTRATE HOLDER

BACKGROUND OF THE INVENTION

1. Field of the Invention

The present invention relates to an apparatus used in semiconductor processing, and more specifically, to a substrate holder to support a substrate during the performance of a process on the surface(s) of the substrate.

2. Description of the Prior Art

The surfaces of substrates are routinely subjected to various processes in the production of LSIs (large scale integrated circuits), LCDs (liquid crystal displays), and data storage disks. In the production of data storage disks in the form of hard disks, a substrate holder is typically used during processing to vertically support a circular substrate having a hole formed in its center.

FIG. 9 is a schematic front view of a conventional substrate holder 1. FIG. 10 is a schematic perspective view which illustrates the operation of substrate holder 1 shown in FIG. 9. Substrate holder 1 shown in FIGS. 9 and 10 includes a base plate 11 which is disposed vertically, and fixed support claws 12 and a movable support claw 13 provided on base plate 1.

As shown in FIGS. 9 and 10, base plate 11 is a J-shaped cut-out formed from a square plate. Four fixed support claws 12 are provided in the bottom curved portion of the J-shaped base plate (referred to below as the curved portion). Fixed support claws 12 are disposed in positional relations such that, as shown in FIGS. 9 and 10, there is symmetry of the positions of pair of a support claws with respect to a vertical line which passes through the bottom most point of the J shape (indicated in the figures as central axis 10).

Each fixed support claw 12 comprises an L-shaped member formed from a short rectangular strip which has been bent. There are cut-outs in the curved portion of base plate 11, and the fixed support claws 12 are mounted in these cut-outs, affixed to base plate 11 by a screw or other fastener. The free end or tip of each fixed support claw 12 has a V-shaped indentation such as shown in FIG. 10.

Movable support claw 13 is fixed to the top surface of base plate 11. Movable support claw 13 is formed from an elongate rectangular strip which is bent into an L shape. One end of movable support claw 13 is fixed to the top surface of base plate 11 by a screw or other suitable fastener. The free end or tip portion of movable support claw 13 is positioned on the central axis 10 and is directed downward. A V-shaped indentation is formed in the tip of support claw 13.

The operation of the conventional substrate holder will now be described. Substrate holder 1 holds a substrate 2, such as a substrate for a hard disk, which is in the shape of a circular plate having an opening 20 at its center. Substrate 2 can be fitted to and released from a transfer mechanism 4 which is provided with a substrate pickup arm 3 which holds substrate 2, during transfer as shown in FIG. 10.

As shown in FIG. 10, an opening and closing device 5 which opens and closes (i.e., raises and lowers, thereby engaging and disengaging) movable support claw 13 of substrate holder 1 is provided to be used with substrate holder 1. Opening and closing device 5 includes an opening and closing pin 51 and a displacement mechanism 52. Pin 51 is capable of causing movable support claw 13, which is made of a resilient, flexible material, to bend by displacing the tip end of movable support claw 13 upward. Note that displacement mechanism 52 is capable of moving pin 51 both horizontally (i.e., laterally) and vertically.

The case in which the substrate 2 is mounted in substrate holder 1 will now be described. Substrate pickup 3 inserts its front end in opening 20 in the center of substrate 2, raises it, and carries substrate 2 horizontally to a position close to substrate holder 1. Pin 51 of opening and closing device 5 is then moved laterally by transfer mechanism 52 and is advanced to a position below movable support claw 13 of substrate holder 1. Pin 51 is moved upward, causing movable support claw 13 to bend, as indicated by the dashed line in FIG. 9. This brings movable support claw 13 to an opened state.

Substrate pickup 3 then moves substrate 2 into alignment with base plate 11 of substrate holder 1. Substrate pickup 3 positions substrate 2 at a location which is between movable support claw 13 and fixed support claws 12. Transfer mechanism 4 then lowers substrate pickup 3, such that substrate 2 comes to rest on and is supported by fixed support claws 12.

Displacement mechanism 52 of opening and closing device 5 then lowers pin 51, such that the bending force applied to movable support claw 13 is relaxed and movable support claw 13 returns to a generally horizontal position. The tip (end) portion of movable support claw 13 comes into contact with and engages the upper edge of substrate 2. As a result, movable support claw 13 engages substrate 2 from above. Substrate pickup 3 then moves back and is taken by transfer mechanism 4 to a "standby" position (not shown) to await transfer of another substrate 2. Pin 51 also moves back and returns to a standby position.

To remove substrate 2 from substrate holder 1, the procedure described above is reversed. Displacement mechanism 52 of opening and closing device 5 moves pin 51 laterally to a position below movable support claw 13. Displacement mechanism 52 of opening and closing device 5 causes movable support claw 13 to bend upward by raising pin 51. Transfer mechanism 4 drives substrate pickup 3, and the front end of substrate pickup 3 is inserted into central opening 20 of substrate 2. Substrate pickup 3 rises and lifts up substrate 2. After lifting up substrate 2, substrate pickup 3 returns to a standby position, completing removal of substrate 2 from substrate holder 1.

A processing apparatus in which the above described substrate holder 1 can be used will now be described. FIG. 11 is a schematic plan view which shows a processing apparatus in which the substrate holder shown in FIGS. 9 and 10 may be used.

The processing apparatus shown in FIG. 11 includes a substrate transfer chamber 61 and a processing chamber 62, located adjacent to one another and separated by a gate structure 66. A substrate 2 which is to be processed is mounted on a substrate holder 1 (not shown in FIG. 11) in substrate transfer chamber 61. Substrate holder 1 on which the substrate 2 has been mounted is then moved to processing chamber 62. After processing has occurred in processing chamber 62, the processed substrate is returned to substrate transfer chamber 61, and is removed from the substrate holder.

A sputtering apparatus which produces a magnetic thin film is shown as an example of the substrate processing apparatus of FIG. 11. Two magnition sputtering sources 63 are provided inside the processing chamber 62. Each sputtering source 63 comprises a target 631 which is sputtered and a magnet structure 633 which is provided at the rear of target 631. A sputtering power supply 632 imposes a required voltage on each target 631.

Magnet structure 633 consists of a columnar central magnet 634 which is provided in the center and a ring shaped peripheral magnet 635 which surrounds central magnet 634. Magnet structure 633 establishes arcuate lines 636 of magnetic force which pass through target 631. These lines 636 of magnetic force confine a plasma near the target surface and give rise to magnetron sputtering.

Processing chamber 62 is provided with a vacuum pumping system 64 and with a gas introduction system means 65 for introducing a required plasma gas into its interior. When a voltage is imposed on target 631 by sputtering power supply 632 while a plasma supporting gas is in processing chamber 62, sputtering discharge takes place in the space adjacent to target 631, and a magnetron plasma, P, is formed on each side of the substrate.

As shown in FIG. 11, sputtering sources 63 are installed as a pair such that they are positioned on opposite sides of substrate 2 which is held by substrate holder 1. Since a magnetron plasma P is formed on each side of substrate 2, magnetron sputtering on both surfaces of substrate 2 is brought about by the pair of sputtering sources 63, and thin films are deposited simultaneously on the opposing surfaces of substrate 2.

A processing apparatus in which a substrate holder of the type described above is used must produce high quality results. For example, in order to increase the recording capacity on a substrate for an information recording medium, it is desirable to produce a uniform quality magnetic thin film over a region which extends as close as possible to the peripheral edge of the substrate.

However, with the conventional substrate holder described above, the presence of support claws 12 and 13 interferes with the ability to achieve sufficiently good-quality processing of the substrate surface(s) over an area which includes the regions close to the peripheral edge of substrate 2. Processing the surfaces of the substrate to deposit a thin magnetic film will be used as an example to describe the aforementioned disadvantage of the prior art substrate holder.

As described above, in a conventional substrate holder of the type shown in FIG. 9, a substrate 2 is held by one movable support claw 13 and four fixed support claws 12 whose tips (i.e., ends) are formed into shallow V shapes. The peripheral edge of substrate 2 fits within and is supported by these V shaped tips.

The tip portions of support claws 12 and 13 produce "shadow regions" near the peripheral edge of substrate 2 which interfere with substrate processing. The formation of these "shadow regions" causes a reduction in the quality (i.e., uniformity) of the processing step applied near the peripheral edge of the substrate. This is because in the production of a magnetic thin film, sputtered material from target 633 is blocked by the tip portions of support claws 12 and 13. This causes a local reduction in the film thickness close to the peripheral edge in the regions where support claws 12 and 13 are present.

This reduction in the quality of the substrate surface processing due to shielding of the substrate surface is generally referred to as the "shadow effect." Given the demand for higher-density recording surfaces, shadow effects have become a problem with the type of substrate holder described above because they reduce the surface area of the substrate which may be used for accurate data storage, and hence reduce the storage capacity of the disk.

One approach to reducing the shadow effects caused by the presence of support claws on a substrate holder is to reduce the number of support claws. In this regard, in order to hold a substrate 2 such as described above vertically, it has been found satisfactory to use three support claws.

If there are four or more support claws, the fourth and additional support claws often do not contact the substrate unless they are mounted with very high precision. In this situation, the position in which the substrate is supported varies depending on which three claws contact it. Thus, if there are four or more claws, the precision and hence reproducibility of the locations where the substrate is supported is reduced. Therefore, it is preferable that the number of support claws be limited to three.

Substrate holders in which substrates are held vertically by three support claws are described in the disclosures of Japanese Utility Model Publication No. 5-23570, Japanese Laid-open Utility Model Application No. 5-94267, and Japanese Laid-open Patent Application No. 8-274142. However, in the substrate holders described in those applications, the support claw which holds the lower edge of the substrate is the tip (end) portion of a plate spring. Because of this, the place where the claw holds the lower edge is subject to change depending on the substrate's weight and the spring constant of the claw. Thus, these substrate holders have the disadvantage that it is difficult to make the substrate support positions consistent from substrate to substrate.

The support claws which contact the upper edge of a substrate and are described in the disclosures of Japanese Utility Model Publication No. 5-23570 and Japanese Laid-open Utility Model Application 5-94267, contact the substrate's edge at locations which are at an angle of 45 degrees or more relative to a horizontal line through the center of the substrate. These substrate holders have the disadvantage that there is a strong possibility of damaging the quality of the substrate surface as a result of dust particles produced by the support claws.

This is because in thin film deposition processes such as sputtering, a film is deposited not only on the surface of a substrate but also on the surfaces of the support claws. When the material deposited on the surfaces of the support claws reaches a certain thickness, it peels off or flakes because of its internal stress, thereby producing particles. Particles of the thin film are particularly liable to be caused by movement of the support claws when the substrate is inserted into and removed from the substrate holder.

When particles adhere to the surface of a substrate, they cause defects in the form of local irregularities in the film thickness. In the devices described in the disclosures of Japanese Utility Model Publication No. 5-23570 and Japanese Laid-open Utility Model Application No. 5-94267, since the support claws contact the edge of a substrate at locations which are at 45 degrees or more relative to the center of the substrate, there is the probability that dust particles produced by the supports will adhere to the surface of a substrate when they fall down, and defects of the type noted above will occur.

In the substrate holder described in the disclosure of Japanese Laid-open Patent Application No. 8-274142, support claws on the left and right contact the edge of a substrate at locations which are on a line through the center of the substrate. With this device, the probability of adhesion of dust particles is reduced. However, with this type of device, there is essentially no force pressing the substrate downward. As a result, there is a risk that the substrate will not be firmly held in the vertical axis, and thus this type of conventional substrate holder has a disadvantage because it is limited in its ability to securely hold a substrate.

What is desired is a substrate holder which can be used to process a substrate uniformly in surface regions close to the peripheral edge of the substrate, and which is capable of more securely holding a substrate than available substrate holders, without increased risk of particle contamination.

SUMMARY OF THE INVENTION

The present invention is directed to a substrate holder which is used to hold a substrate in a vertical position in a substrate processing apparatus during processing of the substrate. The substrate holder is provided with a base plate which is mounted vertically and three support claws which are mounted on the base plate. The three support claws engage the peripheral edge of a substrate and hold the substrate in a vertical position. One of the three support claws is a fixed support claw which engages the lower edge of the substrate, and whose position does not change when the weight of the substrate is supported. The other two support claws are movable support claws which engage the side edge of the substrate and restrain motion of the substrate. The moveable support claws can be opened and closed when the substrate is placed in and removed from the substrate holder. The two movable support claws are installed on the base plate in a manner so that when the substrate is supported by the fixed support claw they contact the side edge of the substrate at locations which are above the height of the center of the substrate.

In addition, there is provided an opening and closing mechanism which opens and closes the movable support claws. The opening and closing mechanism contacts the movable support claws, or elements which hold the movable support claws, at locations which are lower than the height of the center of the substrate.

When the substrate is lowered from a required height and set on the fixed support claw, the movable support claws come into contact with the substrate at side-edge locations at 5 degrees to 45 degrees above a horizontal axis through the center of the substrate. In one embodiment, the movable support claws are provided at the tip (ends) of plate springs.

Inner-side stoppers are provided to restrain the movable support claws in required positions when the substrate is set on the fixed support claw. The movable support claws may be provided at the tip ends of plate springs or may be constituted by plate springs. Outer-side stoppers are provided in order to restrain further opening of the movable support claws at required positions. The movable support claws and the fixed support claw are all detachably mountable on the base plate.

The base plate possesses a generally circular opening with a diameter greater than that of the substrate. The substrate is positioned within the opening and lowered onto the fixed support claw. The fixed support claw and the movable support claws are provided on the base plate in a manner such that they project inward from the edge of the generally circular opening and contact the peripheral edge of the substrate. When the substrate is installed, it is surrounded by the peripheral edge of the opening apart from regions where the fixed support claw and the movable support claws are located. The gap between the peripheral edge of the substrate and the edge of the generally circular opening or the substrate-side edge of an element which is mounted on the base plate is preferably 7 mm or less. The three support claws and elements by which the support claws are mounted on the base plate have a width which is not more than the base plate thickness, and they do not project from the plate surface of the base plate.

Another embodiment of the present invention is a substrate holder which is used for supporting a substrate in a vertical position in a substrate processing apparatus during processing. The substrate holder is provided with a vertical base plate and a plurality of support claws which are mounted on the base plate in a manner such that they contact the peripheral edge of a substrate and hold the substrate in a vertical position. These plural support claws are band-plate-shaped elements for which the substrate thickness direction is the width direction, and the thickness of the substrate-contacting portions of the support claws is 0.2 mm to 2 mm.

BRIEF DESCRIPTION OF THE DRAWINGS

FIG. 5A is a graph showing the film uniformity characteristics at a radial distance of 40 mm from the center of a substrate on which a magnetic thin film has been produced using the conventional substrate holder device shown in FIG. 9.

FIG. 5B is a graph showing the film uniformity characteristics at a radial distance of 46.5 mm from the center of a substrate on which a magnetic thin film has been produced using the conventional substrate holder device shown in FIG. 9.

DESCRIPTION OF THE PREFERRED EMBODIMENT

Figure 1:
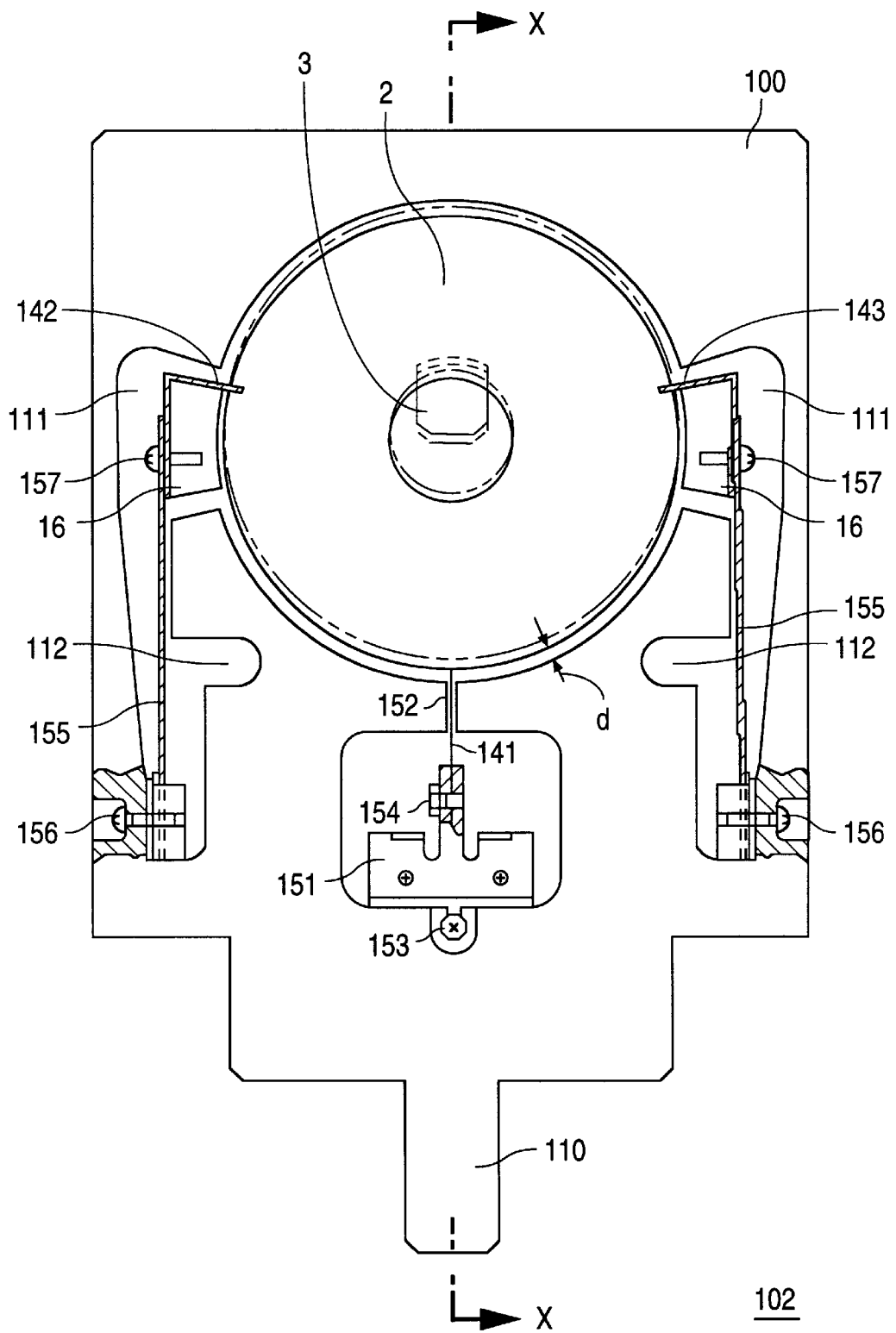
FIG. 1 is an elevation view showing the structure of a substrate holder according to a first embodiment of the present invention.
Figure 2:
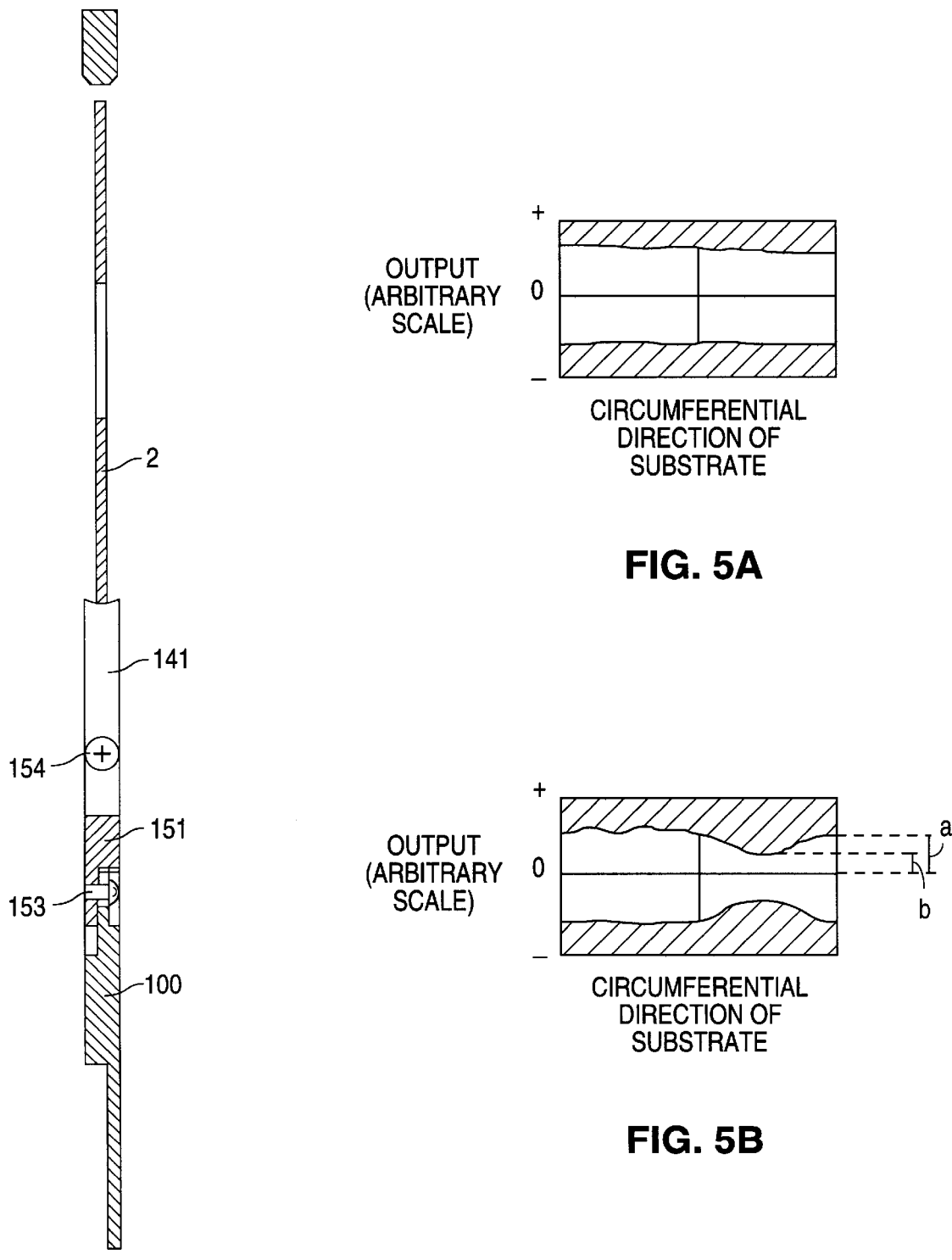
FIG. 2 is shows the cross-section of the substrate holder of FIG. 1, taken along line X—X of the figure.

FIG. 1 is an elevation view showing substrate holder 102 according to a first embodiment of the present invention. FIG. 2 shows the cross-section of the substrate holder of FIG. 1, taken along line X—X. Substrate holder 102 may be used to hold a circular substrate 2 with a diameter of about 95 mm as may be used in a "hard disk" memory device. In this situation, the thickness of substrate 2 is about 0.8 mm, and its weight is about 14 grams.

Substrate holder 102 shown in FIG. 1 includes a base plate 100, and three support claws 141, 142 and 143. Support claws 141, 142, and 143 are mounted on base plate 100 in a manner such that in operation they contact the peripheral edge of substrate 2 and firmly hold substrate 2 in a vertical position.

Base plate 100 has a generally rectangular plate shape. A mounting portion 110 adapted to be mounted on a transfer carrier (not shown) is formed at the lower portion of base plate 100. The transfer carrier is used to move substrate holder 102 horizontally (laterally) to a desired position.

As shown in FIG. 1, a generally circular opening which is slightly larger than substrate 2 is formed in base plate 100. In operation substrate 2, is supported by substrate holder 102 within this opening.

Of the three support claws 141, 142 and 143, support claw 141 is a fixed support claw which supports the lower edge of substrate 2, while the remaining two support claws 142 and 143 are moveable support claws which contact the side edges of substrate 2.

The shape and the mounting structure of fixed support claw 141 shown in FIGS. 1 and 2 will now be described. Fixed support claw 141 is detachably fixed to base plate 100 by a first mounting fixture 151. As shown in FIG. 2, fixed support claw 141 is an elongate, generally rectangular structure whose width is slightly greater than the thickness of substrate 2. Support claw 141 is oriented such that its width is in the direction of the plate thickness of substrate 2. As shown in FIG. 1, fixed support claw 141 is installed in a manner such that it contacts the substrate at a location which is directly below the center of the substrate.

As shown in FIG. 2, at the tip (end) of fixed support claw 141 is formed a shallow V-shape. This V-shaped portion provides a surface which engages the lower edge of substrate 2. This structure suppresses movement of substrate 2 in the directions into and out from the plane of FIG. 1. Increasing the depth of the "V", i.e., making the angle sharper, makes the support of substrate 2 more stable, but has the disadvantage of causing increased shadowing.

Fixed support claw 141 is preferably made of a highly rigid material such as stainless steel or INCONEL®. As shown in FIG. 1, the plane defined by claw 141 is generally perpendicular to the plane defined by the substrate. Thus, when substrate 2 is supported, there is substantially no bending or changing of the support positions due to elasticity of the material from which support claw 141 is made. Therefore, the support position of substrate 2 can be made consistent. Even if fixed support claw 141 bends slightly when substrate 2 is set on it, in most cases there will not be a problem because claw 141 will return to a vertical state by virtue of the elasticity of the material from which it is fabricated.

As shown in FIG. 1, a first bottleneck 152 is formed in base plate 100 extending vertically downward from the lower edge of the opening of base plate 100. As further shown in FIG. 1, a generally square opening is formed at the lower end of first bottleneck 152. Mounting fixture 151 is mounted on base plate 100 at the lower edge of this square opening.

As can be seen from FIG. 2, a recess is formed at the lower edge of the square opening of plate 100, and mounting fixture 151 is installed in the recess such that the combined thickness of the base plate and the mounting fixture 151 is substantially the same as the thickness of the mounting plate.

Mounting fixture 151 is fixed to base plate 100 by a screw 153 or other suitable fastener.

Mounting fixture 151 has a portion which projects vertically upwards. Fixed support claw 141 is inserted in a gap formed in this portion. Fixed support claw 141 is inserted into this gap and is firmly held by a screw 154 or other suitable fastener.

The shape and mounting structure of movable support claws 142 and 143 will now be described. As shown in FIG. 1, movable support claw 142 on the left side of base plate 100 has the shape of an elongate rectangle which is bent into an "L" shape. The bent tip (end) portion of movable support claw 142 is directed towards the center of substrate 2 when substrate 2 is supported on fixed support claw 141. Like fixed support claw 141, the tip (end) of movable support claw 142 is formed to have a shallow V-shape which assists in suppressing movement of substrate 2 during processing.

In the preferred embodiment, movable support claw 142 is mounted on the end of a plate spring 155. As shown in FIG. 1, plate spring 155 is installed in a generally vertical orientation. The lower end of plate spring 155 is fixed to base plate 100 by a screw 156 or other suitable fastener. Plate spring 155 is capable of motion centered about the portion where it is fixed by screw 156.

Plate spring 155 is provided with a fill-in block 16 in addition to movable support claw 142. As shown in FIG. 1, the rear end of movable support claw 142 is held between plate spring 155 and block 16. Screw 157 passes through plate spring 155 and movable support claw 142 and is screwed into block 16. Movable support claw 142 and block 16 are mounted at the end of plate spring 155.

Block 16 fills in the space between movable support claw 142 and substrate 2 and prevents entry of plasma during processing of substrate 2. Seen from the front, block 16 has a generally trapezoidal shape, and has a thickness approximately the same as the thickness of base plate 100. The edge of block 16 next to the substrate has an arcuate shape. The center of this arc coincides with the center of substrate 2 supported on fixed support claw 141.

An opening 111 is formed in base plate 100 to permit movable support claw 142, plate spring 155, and fill-in block 16 to move integrally. Opening 111 connects to the circular opening at the upper end, and extends downward. Further, below its central portion, it connects to an opening 112 for arm actuation into which an opening and closing lever 71 of an opening and closing mechanism is inserted (see FIG. 3).

As shown in FIG. 1, movable support claw 143 is substantially the same as movable support claw 142. When inserted into substrate holder 102, substrate 2 is restrained on the right and the left sides by support claws 142 and 143.

Figure 3:
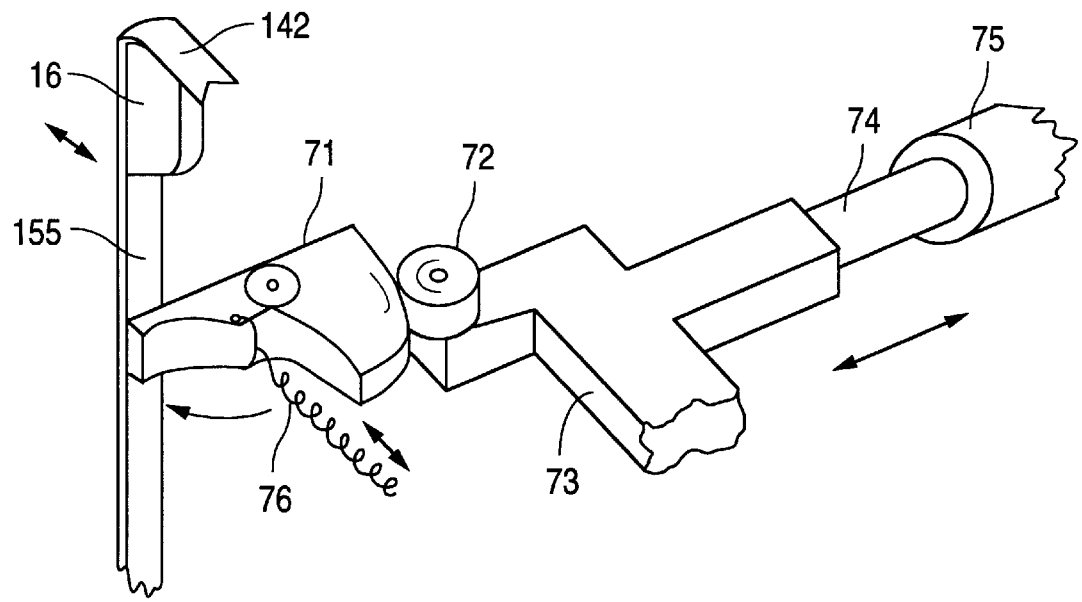
FIG. 3 is a schematic perspective view for describing the actuation of the movable support claws shown in FIG. 1.

The opening and closing mechanism which controls the motion of movable support claws 142 and 143 will now be described. FIG. 3 is a schematic perspective view for describing the actuation of movable support claws 142 and 143 shown in FIG. 1.

The mechanism which opens and closes movable support claws 142 and 143 includes an opening and closing lever 71 which is supported on a vertical rotation shaft. Lever 71 is moved through a required angle by a roller 72 which contacts it. Roller 72 is mounted at the front end of a cam holder 73. Cam holder 73 is fixed to a drive rod 74, which is connected to a linear displacement source 75 such as an air cylinder. Linear displacement source 75 moves cam holder 73 horizontally.

In order to open movable support claw 142, linear displacement source 75 pushes drive rod 74 forward causing cam holder 73 to advance. This causes roller 72 to advance and contact (engage) lever 71. Roller 72 pushes lever 71 causing it to turn approximately 90 degrees. Lever 71 pushes on plate spring 155 at a location which is approximately at the height of the center of plate spring 155. As described above, plate spring 155 which is connected to movable support claw 142 and block 16 is pushed outward by lever 71. Movable support claw 142 and block 16 move towards the exterior of base plate 100, away from the opening in the base plate. Movable support claw 142 is opened by this action.

To close movable support claw 142, linear displacement source 75 pulls in drive rod 74 and causes cam holder 73 to move back. When roller 72 moves back, a restoring spring 76 causes lever 71 to turn in the opposite direction and move away from plate spring 155. Plate spring 155 is returned to its original vertical position by its resilient force.

Another opening and closing lever 71 and roller 72 are provided at the other end of cam holder 73 (not shown) to actuate moveable support claw 143. The two levers 71 at opposing ends of cam holder 73 are connected to each other by restoring spring 76. Levers 71 and rollers 72 on opposite sides open and close movable support claws 142 and 143 on opposite sides of cam holder 73 substantially simultaneously.

The opening and closing mechanism actuates the moveable support claws at locations which are at approximately the height of the centers of the springs. The opening and closing mechanism of the present invention effectively prevents any particles which are produced during actuation of the movable support claws from adhering to substrate 2.

When lever 71 comes into contact with a plate spring 155, there is a risk of particles being produced because sputtered material deposited on the plate spring 155 may be scraped off, or the surface of the spring itself may be abraded. If the location of contact of lever 71 were made higher than at the height of the center of substrate 2, there would be a possibility that particles produced would adhere to substrate 2 since they would pass over the substrate as they fall downward. However, in the embodiment of the present invention shown in FIGS. 1–3, this problem is effectively prevented, since the contact location of opening and closing lever 71 is lower than the height of the center of substrate 2. The problem of adhesion of dust particles to substrate 2 can be further prevented by covering all of opening 111 or the portion of opening 111 where actuation of the moveable support claws occurs.

According to one aspect of the present invention, in order to make the shadow effect due to support claws 141, 142 and 143 as small as possible, the claws should have a thickness of about 0.5 mm. The inventors have determined that if the thickness of support claws 141, 142 and 143 exceeds 2 mm, the shadow effect becomes large enough to cause problems.

Support claws 141, 142 and 143 are preferably made of steel such as stainless steel or INCONEL®. If the thickness is less than 0.2 mm, there may arise the problem that, when a substrate 2 which is about 10–15 grams in weight is supported, the mechanical strength of the support claws is too small and fixed support claw 141 bends. This causes its support position to change, such that substrate 2 cannot be supported properly.

Accordingly, the thickness of support claws 141, 142 and 143 is preferably in the range of 0.2 to 2 mm. Since it is the tip (end) portions of support claws 141, 142 and 143 which have the greatest contribution to the shadow effects, in most cases there are no practical problems if the thickness of portions of the claws other than the tip portions exceeds 2 mm.

In the substrate holder device of the present invention, support claws 141, 142 and 143 and mounting devices 151 which fix the position of support claws 141, 142 and 143 have a width which is less than the thickness of base plate 100, and do not project from the plate surfaces of base plate 100. Thus, the substrate holder of the present invention is particularly suitable for transfer through a narrow space.

In an in-line multi-chamber substrate processing device, the chambers are hermetically connected, with gate valves provided at the chamber boundaries. The opening area of the gate valve is made as small as possible, in order to prevent the atmospheres of the chambers from contaminating one another. The substrate holder device is transferred into the chambers via the gate valve by being passed through a narrow gate valve opening.

In such a situation, if there are elements which project from the surface of base plate 100, there is a risk that, because of some form of flexing, these projecting elements will catch on the edge of the gate valve opening and impede transfer of the substrate holder device. While the gate valve opening could be made larger to prevent this from happening, as described above, it is best to keep the gate valve opening as narrow as possible. This goal may be achieved with the present invention, since no elements project from the plate surfaces of base plate 100, and transfer operations can be effected even in a narrow space.

The operation and use of the inventive substrate holder device will now be described. First, the operation by which a substrate 2 is mounted in the substrate holder will be described.

Substrate 2 is supported by substrate pickup 3 and transferred by a displacement mechanism (not shown) to the location of the substrate holder. The displacement mechanism stops substrate pickup 3 at the position where substrate 2 is indicated by a dotted line in FIG. 1. As shown, substrate 2 is temporarily raised at the time of a substrate's mounting or removal.

After substrate 2 has been positioned at this raised position, the displacement mechanism lowers substrate pickup 3, setting substrate 2 onto fixed support claw 141 as indicated by the solid line in FIG. 1. A set time after substrate pickup 3 starts to move down, movable support claws 142 and 143 are moved into contact with the side edge of substrate 2 as described above. This occurs partway through the descent of substrate 2.

This operation will be described in further detail with reference to FIG. 4, which is a drawing showing the motion of movable support claw 142 of FIG. 1. Before substrate 2 is installed, movable support claw 142 is opened, i.e., it is bent slightly from vertical, as indicated by the two-dot chain line in FIG. 4. This state is one in which roller 72 of the opening and closing mechanism shown in FIG. 3 has moved forward and lever 71 has pushed plate spring 155 outward.

A predetermined time after substrate 2 starts to be lowered from the raised position in the manner described above, the opening and closing mechanism moves roller 72 back and lever 71 is returned to its original position. As a result, plate spring 155 moves towards the opening in substrate holder 101 because of its resilient force. As indicated by the dotted line in FIG. 4, the tip of movable support claw 142 comes into contact with the side edge of substrate 2 which is being lowered from the raised position. If the center O' of substrate 2 at the moment of contact is taken as a reference and the position (referred to below as the gripping start position) at which the tip of movable support claw 142 comes into contact is indicated as the angle θ', this position is located at about 5–45 degrees from the horizontal relative to the center O'.

Substrate pickup 3 continues to move down after the start of contact between the substrate and movable support claw 142. As indicated by the fall lines in FIGS. 1 and 4, the tip of movable support claw 142 continues to be in contact with the edge of substrate 2 up until substrate 2 is set on fixed support claw 141. The result is that the tip of movable support claw 142 may slide a little on the edge of substrate 2 after it first contacts the substrate.

When the substrate reaches its final position, the contact position (referred to below as the contact position at the time of mounting) of the tip of movable support claw 142 is at about 5 to 45 degrees above the horizontal relative to the center 0. This angle is represented in FIG. 4 as angle θ.

Thus, in the substrate holder of the present invention, movable support claw 142 starts to come into contact with the edge of the substrate at a contact start location which is at an angle of 45 degrees or less relative to the height of the center of substrate 2. When installation is completed, there is contact between the substrate and holder at a location which is above the center of the substrate. Therefore, the substrate support is stabilized and the problem of particles being generated and contaminating the substrate is reduced.

If movable support claw 142 were to come into contact with the substrate at an angle exceeding 45 degrees, the probability of dust particles being released because of contact rebound and adhering to the surface of substrate 2 would be increased. This problem is reduced in the present invention, since the angle is not more than 45 degrees. On the other hand, if movable support claw 142 contacts the edge of substrate 2 at a height below the center of substrate 2, there would be no force pressing on the substrate 2 from above, and there would be a risk of substrate 2 moving during processing.

Figure 4:
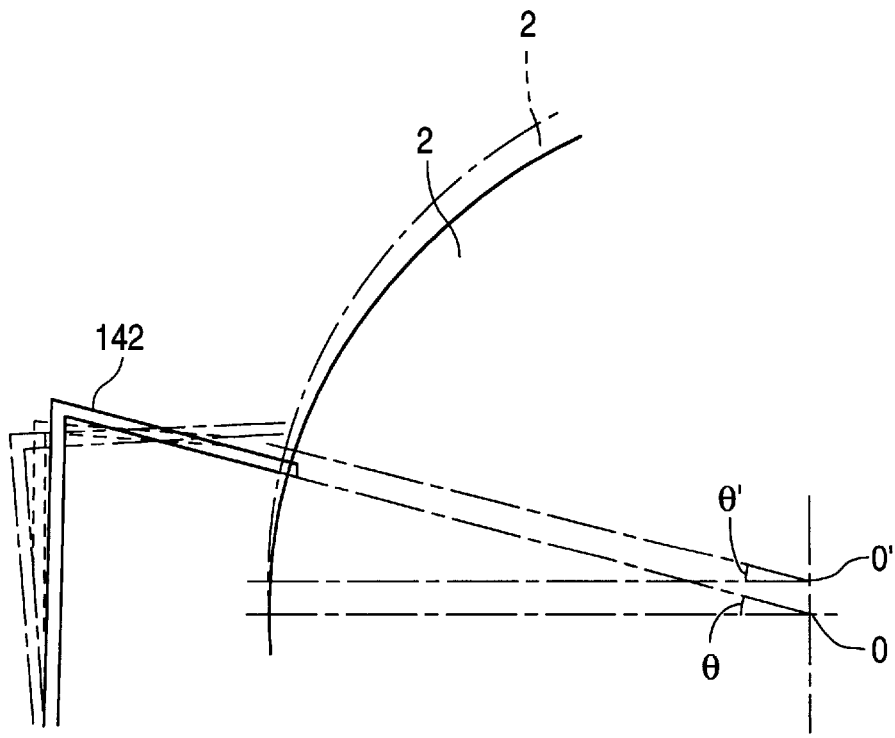
FIG. 4 is a drawing showing the motion of the movable support claws of FIG. 1.

Although movable support claw 143 on the right is not shown in FIG. 4, it is operated in the same way as movable support claw 142.

When substrate 2 has been installed in the manner described above, substrate pickup 3 moves down and is positioned in the center of the central opening of substrate 2. It is then moved back and withdrawn from the opening and moved to a "standby" position by the displacement mechanism. This completes the substrate installation operation.

Removal of substrate 2 is performed by a procedure which is opposite to that of the installation operation described above. After substrate pickup 3 has been moved and positioned in the central opening of substrate 2 by the displacement mechanism, it is raised up. When being raised, the edge of the central opening of substrate 2 sets on substrate pickup 3, and the lower edge of substrate 2 moves away and is disengaged from fixed support claw 141.

When substrate pickup 3 rises further, the opening and closing mechanism is actuated after a set time lag, and plate springs 155 are opened. Rollers 72 move forward and push opening and closing levers 71. Opening and closing levers 71 turn and cause plate springs 155 to displace outward. Movable support claws 142 and 143 are bent open toward the exterior of base plate 100.

Substrate pickup 3 stops in a state in which substrate 2 has been raised to a desired position. After that, the displacement mechanism moves substrate pickup 3 horizontally (laterally), and substrate 2 is removed from substrate holder 102 and transferred to a desired location.

As can be seen from the description above, in the operation of the present invention, movable support claws 142 and 143 open only after substrate pickup 3 holds substrate 2. This prevents the toppling of substrate 2 when the substrate is raised from fixed support claw 141. If movable support claws 142 and 143 opened before substrate 2 was held in a stable manner, support would only be provided by fixed support claw 141, and substrate 2 would not be able to stand independently. In the present invention, this problem is prevented, since movable support claws 142 and 143 open only after substrate pickup 3 engages substrate 2.

In the present invention, support claws 141, 142 and 143 are detachably mounted on base plate 100. To remove fixed support claw 141, screw 153 is loosened and mounting fixture 151 is removed from base plate 100, and then screw 154 is loosened and fixed support claw 141 is removed from mounting fixture 151. After a different fixed support claw 141 has been inserted into mounting fixture 151 and fixed by a screw, mounting fixture 151 is re-fixed by a screw to the base plate. For movable support claws 142 and 143, screws 156 are loosened and plate springs 155 are taken from base plate 100, and then screws 157 are loosened and the movable support claws are removed from spring plates 155. Replacement movable support claws 142 and 143 are similarly fixed by screws and mounted on base plate 100.

When the inventive substrate holder is used as part of a film deposition (e.g., sputtering) process, the described replacement of support claws 141, 142 and 143 may be performed after processing has been repeated a number of times. During sputtering, films are deposited on support claws 141, 142 and 143. Although the problem of particles released from films adhering to support claws 142 and 143 is reduced, as described above, if the films become thick enough, they can peel off because of internal stress, and the risk of particulate contamination can become significant. Thus, it is advisable to periodically replace support claws 141, 142 and 143 with new ones after a predetermined number of deposition processes.

Note that support claws 141, 142 and 143 which have been used can be re-used if the films adhering to their surfaces are removed, such as by sand-blasting or chemical means. If there is considerable erosion of the surfaces of support claws 141, 142 and 143 during film removal, re-use may not be possible if the dimensions are no longer within specification. If support claws 141, 142 and 143 are formed from stainless steel, they may be usable only a limited number of times.

With the device of the present invention, since base plate 100 is left as it is and only support claws 141, 142 and 143 are replaced, film removal is easy, and down time of the substrate processing system is minimized.

In the substrate holder of the present invention, substrate 2 is installed in the generally circular opening of base plate 100, and the space around substrate 2 is filled by base plate 100 or by an element which is mounted on base plate 100 (e.g., block 16). The distance between the edge of the generally circular opening in the substrate holder and the edge of the substrate 2 is about 3 mm, and the distance between the edge of substrate 2 and the edge of the substrate side of block 16 is preferably about 2 mm. The gap formed around the substrate is preferably about 2 to 3 mm.

Note that the substrate holder device of the present invention is well suited for use in a substrate processing apparatus in which a plasma is formed near the substrate, such as in the sputtering apparatus described above. The substrate holder of the present invention overcomes a significant disadvantage of prior art substrate holders used during plasma processing.

The inventors have determined that when there is a gap between a substrate and a substrate holder in a plasma processing operation, the plasma may penetrate into the gap and affect the quality of the processing operation (e.g., the thickness or uniformity of the film deposited). It was further determined that this effect is increased when a negative bias voltage is imposed on the substrate.

A plasma will diffuse to fill the surrounding space, and when a gap of sufficient size is formed around a substrate, the plasma may penetrate into the gap. This diffusion effect is somewhat pressure dependent.

When a plasma penetrates into a gap around a substrate, and if the manner in which it enters is nonuniform, it is possible that processing of the surface of the substrate will become nonuniform. When a substrate 2 is supported inside a J-shaped cut-out in a base plate 11 as in the prior art substrate holder shown in FIG. 9, the gap around substrate 2 is nonuniform, i.e., the gap is not constant around the periphery of the substrate. In this regard, there is a gap formed between the edge of substrate 2 and the edge of the cut-out of base plate 11. There is also an open space which is not enclosed by base plate 11.

When there is a nonuniform gap around the substrate, the plasma penetrates into the space in a nonuniform manner. For example, there is weak diffusion of the plasma in the wider portions of the space, whereas in the narrower portions there is an effect similar to that of a hollow cathode, and a more concentrated plasma flows in. It is also possible that there will be minimal or almost no penetration of plasma if the gap is made sufficiently narrow.

In the case of a sputtering process, non-uniformity of the plasma results in non-uniformity of the sputter discharge, resulting in non-uniformity of the film thickness deposited on a substrate. In addition, non-uniformity of the plasma also results in nonuniform processing using species which are formed in the plasma.

Figure 9:
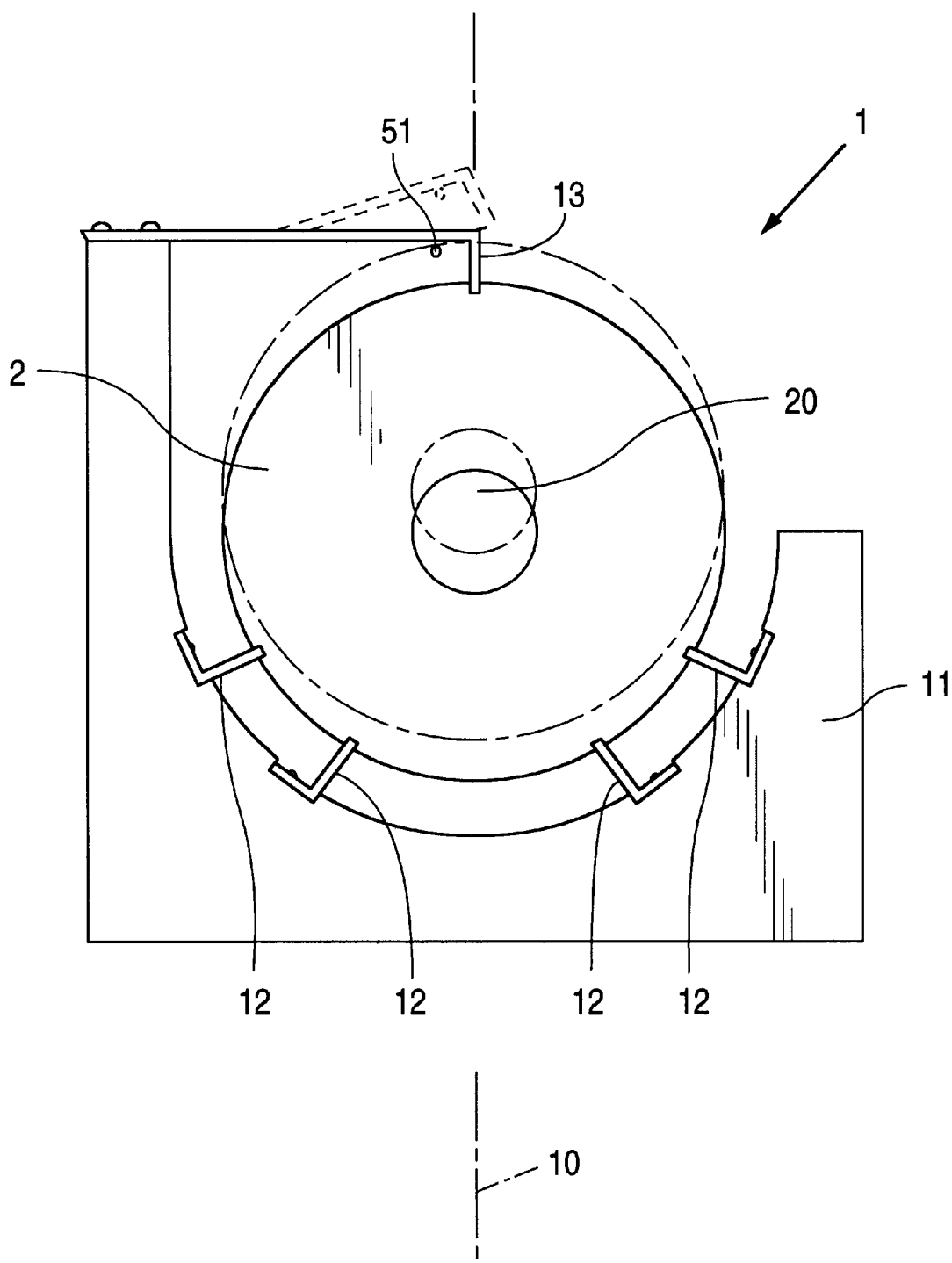
FIG. 9 is a top view showing the structure of a conventional substrate holder device.
Figure 10:
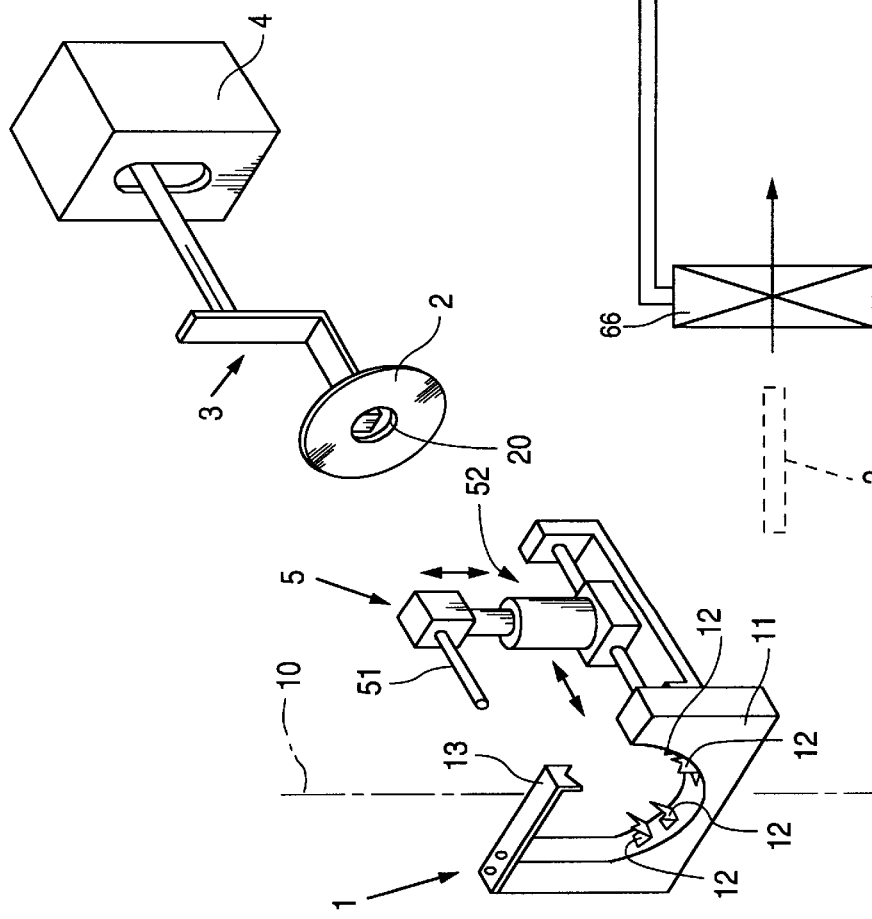
FIG. 10 is a schematic perspective view used to describe the operation of the substrate holder device of FIG. 9.

FIG. 5A is a graph showing the film uniformity characteristics at a radial distance of 40 mm from the center of a substrate on which a magnetic thin film has been produced using the conventional substrate holder device shown in FIG. 9. FIG. 5B is a graph showing the film uniformity characteristics at a radial distance of 46.5 mm from the center of a substrate on which a magnetic thin film has been produced using the conventional substrate holder device shown in FIG. 9. The figures show the modulation characteristic of a substrate on which a magnetic thin film was produced by imposing a −300V direct-current bias voltage on the substrate.

The modulation characteristic shown in the figures indicates whether or not there is modulation, i.e., abnormal variation of an output signal read from the substrate. In the present situation, such an abnormal variation is related to whether or not the magnetic properties of the magnetic thin film produced on the substrate 2 are uniform around the periphery of the substrate. Specifically, FIGS. 5A and 5B show measurements of the coercive force and residual magnetic flux in the substrate circumferential direction after conversion to electrical signals. As noted, FIG. 5A shows the modulation characteristic at a radius of 40 mm, and FIG. 5B shows the modulation characteristic at a radius of 46.5 mm from the substrate center.

As shown in FIG. 5A, when a conventional substrate holder is used, the output signal is generally uniform at the 40 mm radius location, but as shown in FIG. 5B, the output signal is non-uniform and modulation occurs at a radius of 46.5 mm. These results suggest that the non-uniformity is due to the varying gap size around the periphery of the substrate. The occurrence of modulation in the region close to the peripheral edge of the substrate appears to be due to the non-uniformity of the plasma in the gap region.

The inventors have determined that there are two ways of preventing nonuniformity of processing due to non-uniformity of the plasma in the gap. One way is to make the size of the space around the substrate 2 as uniform as possible, so as to make the amount of plasma that enters (i.e., the plasma density) uniform.

The second way of preventing the non-uniform processing due to nonuniformity of the plasma is to make the gap around the substrate 2 as small as possible, so as to prevent significant penetration of the plasma. If plasma does not enter, then there will be very limited (if any) variation in the processing of the substrate on the opposing sides of the substrate. Following this approach, the gap formed between the substrate and substrate holder in the device of the present invention is made to be between 2 to 3 mm.

Figure 6A:
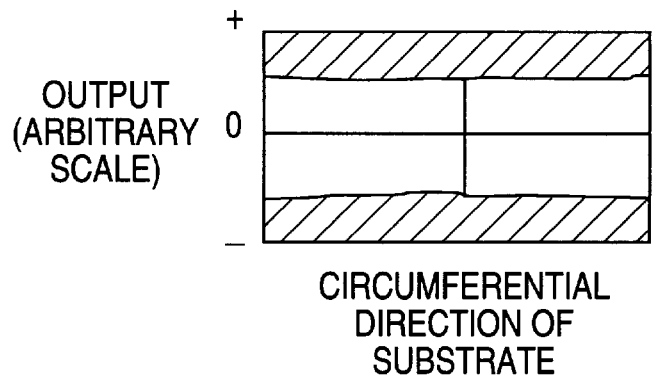
FIG. 6A is a graph showing the film uniformity characteristics at a radial distance of 40 mm from the center of a substrate on which a magnetic thin film has been produced using the substrate holder device of the present invention.
Figure 6B:
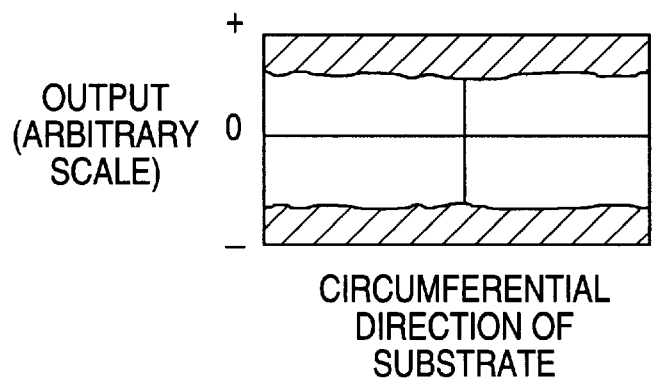
FIG. 6B is a graph showing the film uniformity characteristics at a radial distance of 46.5 mm from the center of a substrate on which a magnetic thin film has been produced using the substrate holder device of the present invention.

FIG. 6A is a graph showing the film uniformity characteristics at a radial distance of 40 mm from the center of a substrate on which a magnetic thin film has been produced using the substrate holder device of the present invention. FIG. 6B is a graph showing the film uniformity characteristics at a radial distance of 46.5 mm from the center of a substrate on which a magnetic thin film has been produced using the substrate holder device of the present invention. As may be seen from a comparison between FIGS. 5 and 6, when the device of the present invention is used, the output signal is uniform at both radial locations, and no modulation is observed. This provides a significant improvement over the results obtained from prior art substrate holders, and permits a greater surface area of the substrate to be used for data storage, etc.

Note that it is not possible to make the space around substrate 2 perfectly uniform and narrow. This is because it is necessary to leave a certain amount of space for insertion and/or movement of the support claws. Further, it is necessary to maintain sufficient separation to apply a bias voltage on the support claws relative to grounded base plate 100. In these regions it is also important to prevent entry of plasma by making the gap in the portion where the support claws 141, 142 and 143 are inserted as small as possible.

Figure 7:
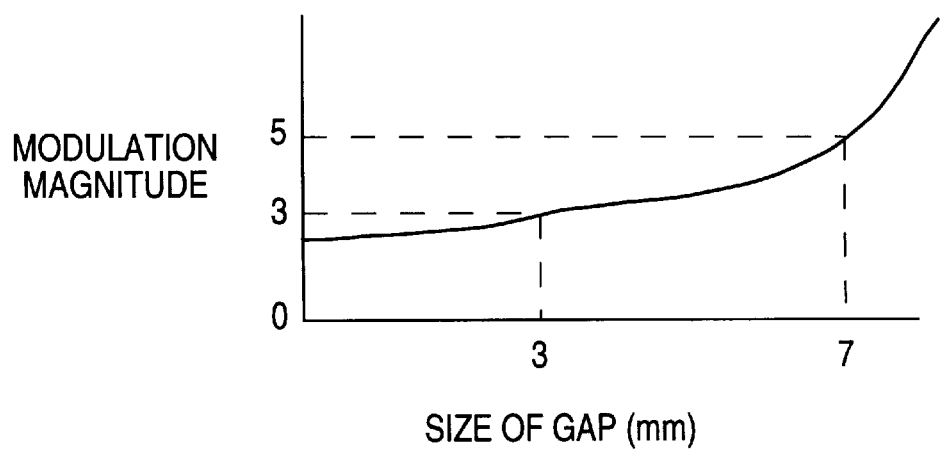
FIG. 7 is a graph showing the relation between the size of the gap between a substrate and the base plate of a substrate holder and the magnitude of the modulation, indicating the degree to which modulation increases when the gap is made larger.

The relationship between the magnitude of the output signal modulation and the size of the gap formed around the substrate will now be discussed in greater detail. FIG. 7 is a graph showing the relation between the size of a gap formed between a substrate and the base plate of a substrate holder and the magnitude of the modulation indicating the degree to which modulation increases when the gap is made larger. The size of the gap on the abscissa in FIG. 7 is the distance (indicated by (d) in FIG. 1) separating the edge of the generally circular opening in the substrate holder and the edge of the substrate. The magnitude of modulation on the ordinate is the difference between the maximum value and minimum value relative to the average value (c) of the output shown in FIG. 5, i.e., (a−b)/2c*100 (±%).

If the gap is made small, plasma does not enter it in any substantial amount, and modulation is significantly reduced. However, it is not possible to state how small the gap should be made in order to reduce the modulation satisfactorily in all cases, since this is also a function of other plasma conditions such as pressure. The data shown in FIG. 7 is for an argon plasma at a pressure of 3 mTorr (milli-torr).

As shown in FIG. 7, with a gap size of up to about 3 mm, the magnitude of the modulation is kept to ±3%, which is acceptable for most purposes. If the gap is larger than 7 mm, the magnitude of the modulation exceeds ±5% and problems may arise.

Generally, as the pressure is increased, the plasma is able to penetrate into smaller gaps. However, under most conditions if the gap is 3 mm or less, the modulation is at a level which is low enough to cause only minimal problems regardless of the pressure and bias voltage conditions. At pressure conditions which are likely to be used in substrate processing the gap may be as large as 7 mm without adverse effect. Preferably, therefore, the gap is 7 mm or less, and most preferably it is 3 mm or less.

Figure 8:
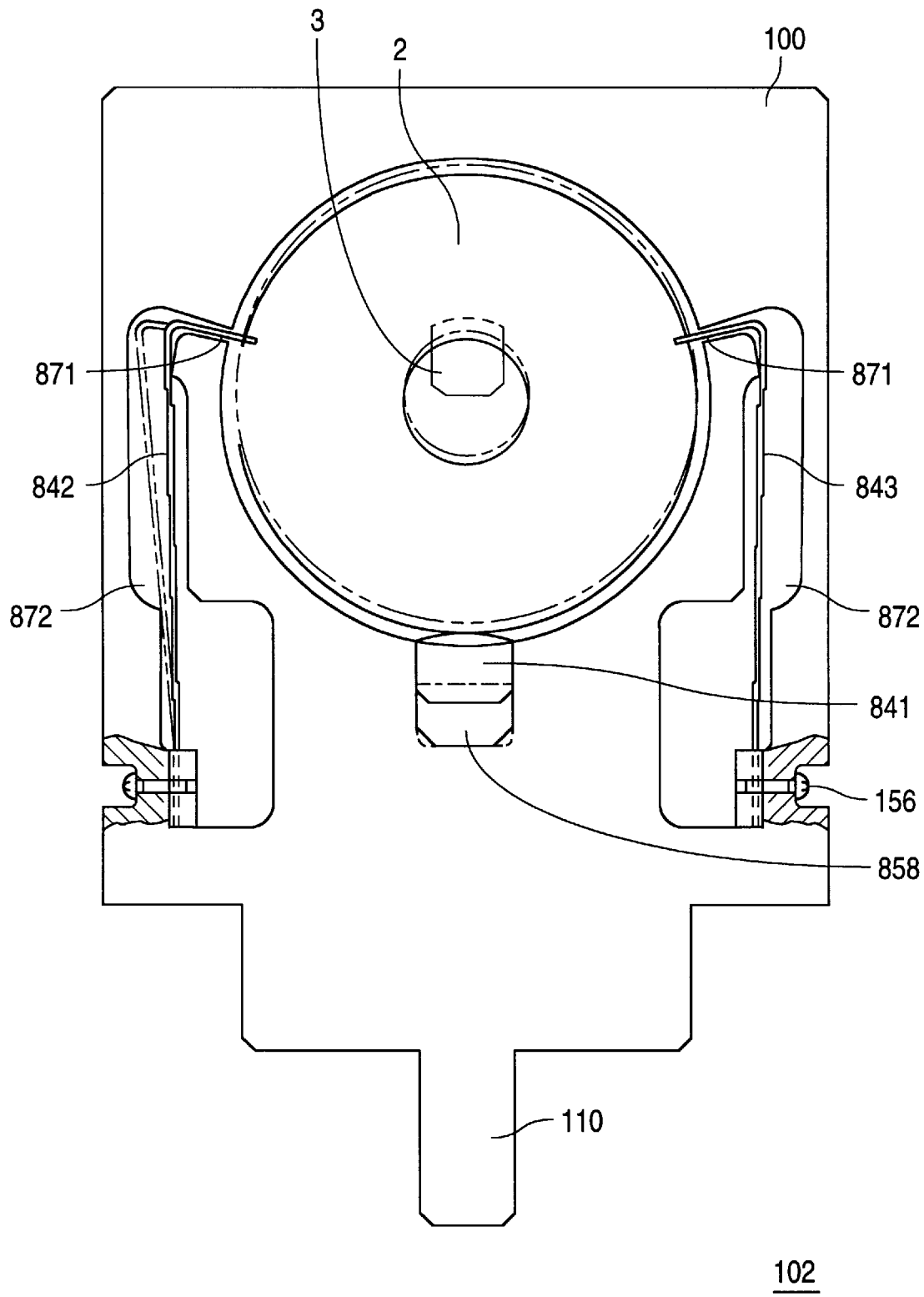
FIG. 8 is a schematic elevation view showing the structure of a second embodiment of the substrate holder of the present invention.

A second embodiment of the present invention will now be described. FIG. 8 is a schematic elevation view showing the structure of a second embodiment of substrate holder 102 of the present invention.

Substrate holder 102 of FIG. 8 includes a base plate 100 and three support claws 841, 842 and 843. Support claws 841, 842, and 843 are mounted on base plate 100 in a manner such that they contact the peripheral edge of a substrate 2 and maintain the substrate in a vertical position. Support claw 841 is a fixed support claw which supports the edge of substrate 2 at the bottom of the substrate, and support claws 842 and 843 are movable support claws which contact the edge of substrate 2 at the sides of the substrate.

The second embodiment of the present invention differs from that of FIG. 1 in that the front end of fixed support claw 841 is shaped so that it is longer in the direction along the edge of the substrate. As shown in FIG. 8, fixed support claw 841 is an element with an approximately square shape. The upper edge portion of fixed support claw 841 projects upward a little, and the front edge of this projecting portion has an arcuate shape which is parallel to the bottom peripheral edge of substrate 2. The curvature of this arc of fixed support claw 841 is approximately the same as the curvature of the peripheral edge of substrate 2.

The front edge of fixed support claw 841 has a shallow V-shape, which is used for fitting into and supporting the lower edge of substrate 2.

Since in the embodiment of FIG. 8, fixed support claw 841 has the structure described, the precision with which substrate 2 is supported at its bottom is improved. With the fixed support claw 141 shown in FIG. 1, there is a slight possibility of motion of the substrate support locations to the left or right, depending on the balance of the elastic forces of plate springs 155 which hold movable support claws 142 and 143. The embodiment of FIG. 8 makes the substrate support at the bottom less prone to movement, since the lower edge of the substrate is held within the arcuate groove.

Fixed support claw 841 is mounted on base plate 100 by means of a mounting fixture 858. Mounting fixture 858 is a generally square element having a grooved upper edge. Fixed support claw 841 is fitted into the groove. The lower corners of mounting fixture 858 are fitted into recesses as formed in base plate 100. Accordingly, fixed support claw 841 is detachably mounted on the base plate.

Movable support claws 842 and 843 of this embodiment are formed from single plate springs. The tip (end) portions of elements with the shapes of band plates are bent in the manner shown in FIG. 8, and these bent tip portions contact the side edge of a substrate 2 loaded into the substrate holder 102. A mechanism of the type shown in FIG. 3 can be used as an opening and closing mechanism for opening and closing these movable support claws 842 and 843.

As shown in FIG. 8, bottlenecks 871 which lead from the generally circular central opening are formed at the locations where movable support claws 842 and 843 are mounted. Movable support claws 842 and 843 perform opening and closing actions while positioned in these bottlenecks 871.

The periphery of substrate 2 is surrounded by the edge of the generally circular opening in base plate 100, apart from the portions where bottlenecks 871 and fixed support claw 841 are provided. The space between the edge of the generally circular opening and the edge of the substrate is a narrow gap of about 3 mm. As in the first embodiment of the invention, the size of the gap is expected to significantly limit penetration of plasma around the substrate, and even if there is penetration, the manner in which the plasma penetrates is expected to be substantially uniform. As a result, the problem of non-uniform processing of the substrate will be significantly reduced, if not eliminated. Openings 872 in base plate 100 are formed in a manner such that they extend downward from the outlets which are the ends of bottleneck 171. These openings are formed as spaces for permitting the plate springs to move.

In FIG. 8, movable support claw 843 is shown as it first contacts the side edge of substrate 2 at a preset position. Movable support claw 842 on the left side, as indicated by the full line in FIG. 8, has swung inward from the position of first contact. In this state, movable support claw 842 contacts the edge of opening 872 which is nearer to substrate 2. The edges of openings 872 which are nearer to substrate 2 function as inner-side stoppers to restrict the motion of movable support claws 842 and 843. These inner-side stoppers prevent movable support claws 842 and 843 from pushing substrate 2 beyond a desired limit, such that high precision of the substrate position in the horizontal direction is maintained.

Movable support claw 842 on the left, as indicated by the dashed line in FIG. 8, is shown moved further outward from the preset position. In this state, the back of movable support claw 842 is in contact with the side of opening 872 which is further away from substrate 2. These sides of openings 872 which are furthest away from substrate 2 function as outer-side stoppers to restrict the motion of movable support claws 842 and 843. The existence of these outer-side stoppers prevents movable support claws 842 and 843 from opening beyond desired limits and being plastically deformed. Note that inner-side stoppers and outer-side stoppers such as those described can also be provided in the first embodiment of the present invention shown in FIG. 1.

Although three support claws 141, 142 and 143 (or 841, 842, and 843) are described with reference to the first and second embodiments, the present invention is intended to include the possible use of four or more support claws. As with the first described embodiment, the thickness of support claws 841, 842, and 843 is preferably in the range of 0.2 to 2 mm.

Figure 11:
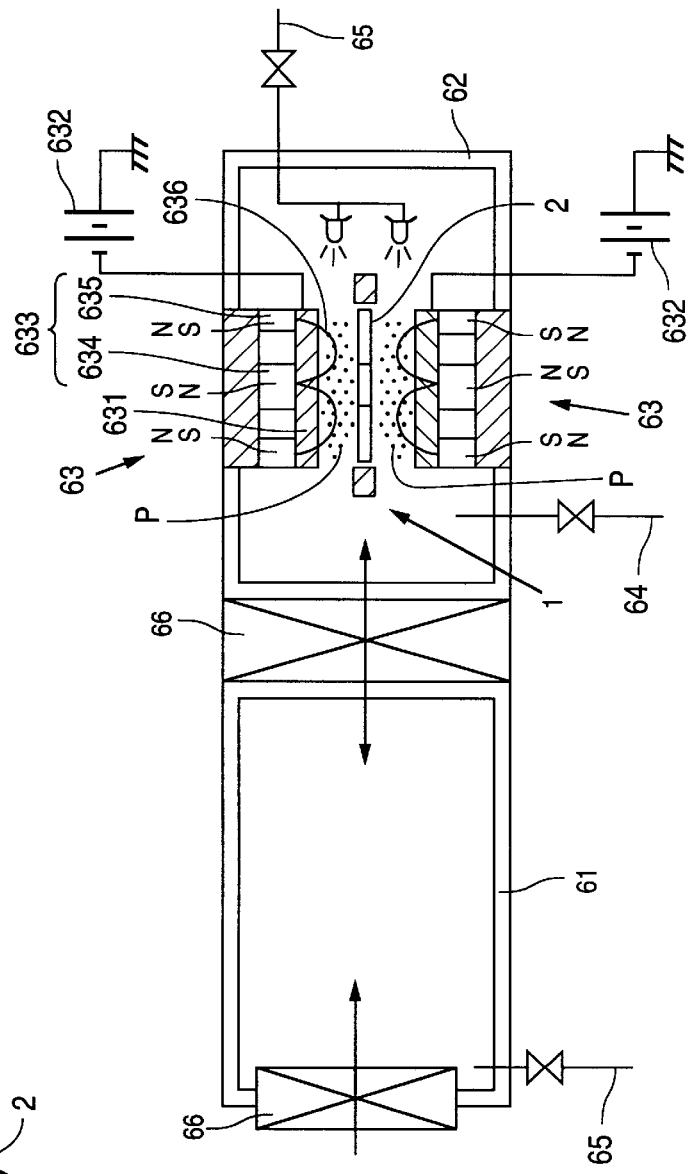
FIG. 11 is a plane view showing the structure of an example of a substrate processing apparatus in which the substrate holder device shown in FIGS. 9 and 10 may be used.

Although the substrate holder of FIGS. 1 and 8 has been described as being suited for used in a thin film deposition apparatus of the type shown in FIG. 11, it can also be used in other processing apparatus such as an etching apparatus or other surface modification apparatus.

As has been described, and in accordance with the present invention, since the bottom edge of the substrate is supported by a fixed support claw, and two movable support claws are installed in a manner such that they contact the side edge at locations which are above the height of the center of the substrate, highly precise, stable support of the substrate is possible with just three support claws. In addition, shadow effects are reduced and the quality of substrate processing is improved.

Further, since an opening and closing mechanism causes opening and closing operations by coming into contact with the movable support claws or with elements which hold the movable support claws at locations which are lower than the height of the center of the substrate, adhesion to the substrate surface of particles which are produced accompanying opening and closing operations is reduced.

The movable support claws start to come into contact with the substrate at side-edge locations which are between 5 degrees to 45 degrees relative to the center of the substrate when the substrate is set on the fixed support claw. This reduces the number of particles produced which are likely to contaminate the substrate due to the contact of the movable support claws and rebounding of the substrate from the movable support claws is significantly reduced.

Since the movable support claws are provided at the tip ends of plate springs, the thickness of the plate springs can be set to a required thickness, and the thickness of the movable support claws can be reduced. Therefore, the shadow effects caused by the movable support claws can be controlled and significantly suppressed.

In addition, there is the added advantage that high precision of the substrate positioning in the horizontal direction is maintained, since the positioning of the movable support claws is constrained. Further, since the movable support claws are prevented from opening beyond desired limits, plastic deformation of the plate springs is prevented.

Since the movable support claws and the fixed support claw are all detachably mountable on the base plate, maintenance work for the removal of thin films which have been deposited on the support claws can be undertaken easily, and the operating costs for the processing steps can be reduced compared to the case where the entire substrate holder device is replaced.

Since the gap around the substrate is a generally uniform space, even if plasma penetrates into this gap, it is less likely that non-uniform processing of the substrate due to this plasma penetration will occur. Since the gap around the substrate is 7 mm or less, penetration of plasma into this gap is significantly reduced under typical pressure conditions.

Since the three support claws and elements by which the support claws are mounted on the base plate have a width which is not more than the base plate thickness itself, and do not substantially project beyond the plate surface of the base plate, the structure is particularly suitable for use in situations in which the substrate holder device is transported through a narrow gate valve. Since the tip portions of the support claws are 0.2 mm to 2 mm thick, it is possible to significantly reduce shadow effects while maintaining mechanical strength.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A substrate holder for supporting a substrate, comprising:
    a base plate having an opening for receiving a substrate;
    at least three support claws positioned on the base plate in a manner such that each of the support claws contacts an edge of the substrate and maintains the substrate in a substantially vertical position when the substrate is loaded into the opening in the base plate, wherein at least one of the support claws is a fixed support claw which contacts a lower edge of the substrate and at least two support claws are movable support claws that can be brought into contact with and separated from the edge of the substrate, and
    wherein the movable support claws are positioned such that the movable support claws contact the edge of the substrate at locations above the height of the center of the substrate and wherein a generally uniform gap is present between the edge of the substrate and the base plate opening when the substrate is placed into the base plate opening the gap being sufficiently narrow to substantially prevent plasma from entering into the gap.

2. The substrate holder of claim 1, wherein the movable support claws engage the substrate at edge locations which are between 5 degrees and 45 degrees above a horizontal line passing through the center of the substrate when the substrate is set on the fixed support claw.

3. The substrate holder of claim 1, wherein the movable support claws are provided at the tip of a plate spring.

4. The substrate holder of claim 1, further comprising:
    an inner-side stopper positioned in order to constrain the motion of the movable support claws in a direction towards the substrate.

5. The substrate holder of claim 1, further comprising:
    an outer-side stopper positioned in order to constrain the motion of the movable support claws in a direction away from the substrate.

6. The substrate holder of claim 1, wherein the movable support claws and the fixed support claw are detachably mountable on the base plate.

7. The substrate holder of claim 1, wherein the opening in the base plate has a generally circular shape with a diameter greater than that of the substrate, and the fixed support claw and movable support claws project inward from an edge of the generally circular opening to contact the peripheral edge of the substrate.

8. The substrate holder of claim 7, wherein the gap between the edge of the substrate and the edge of the generally circular opening is about 7 mm or less.

9. The substrate holder of claim 1, wherein the three support claws have a width which is not more than the thickness of the base plate, and do not substantially extend above or below the surface of the base plate.

10. The substrate holder of claim 7, wherein the gap between the edge of the substrate and the edge of the generally circular opening is about 3 mm or less.

11. A substrate holder, comprising:
    a base plate having an opening for receiving a substrate;
    a plurality of support claws positioned on the base plage in such a manner that each of the support claws contacts an edge of the substrate to maintain the substrate in a substantially vertical position when the substrate is placed into the opening in the base plate, wherein at least one of the plurality of support claws is a fixed support claw which contacts the lower edge of the substrate and at least two of the plurality of support claws are movable support claws that can be brought into contact with and separated from the edge of the substrate;
    wherein the movable support claws are positioned to contact the edges of the substrate and wherein a generally uniform gap is present between the edge of the substrate and the base plate opening when the substrate is placed into the base plate opening, the gap being sufficiently narrow to substantially prevent plasma from entering into the gap.

12. The substrate holder of claim 11, wherein the movable support claw engage the substrate at edge locations which are between 5 degrees and 45 degrees above a horizontal line passing through the center of the substrate when the substrate is placed on the fixed support claw.

13. The substrate holder of claim 11, wherein the movable support claw comprises the tip of a plate spring.

14. The substrate holder of claim 11, further comprising an inner-side stopper positioned in order to constrain the motion of the movable support claw in a direction towards the substrate.

15. The substrate holder of claim 11, further comprising an outer-side stopper positioned in order to constrain the motion of the movable support claw in a direction away from the substrate.

16. The substrate holder of claim 11, wherein the movable support claw and the fixed support claw are detachably mounted to the base plate.

17. The substrate holder of claim 11, wherein the gap between the edge of the substrate and the edge of the generally circular opening is about 7 mm or less.

18. The substrate holder of claim 11, wherein the gap between the edge of the substrate and the edge of the generally circular opening is about 3 mm or less.

19. A substrate holder for use in a plasma processing apparatus, comprising:

a base plate having a generally circular opening into which a substrate may be placed; and a plurality of support claws for supporting the substrate when it is positioned within the base plate opening, each of the support claws comprising a tip end for engaging the substrate and a distal end for mounting the support claw, said tip portion being radially oriented in relation to the central axis of the substrate;

wherein a gap is present between the edge of the substrate and the base plate opening when the substrate in positioned within the opening, and wherein only the tip ends of the support claws are present within the gap when the substrate is held within the base plate opening, said distal ends being outside of the gap.

* * * * *